(12) United States Patent
Ueng et al.

(10) Patent No.: US 8,392,795 B2
(45) Date of Patent: Mar. 5, 2013

(54) LOW DENSITY PARITY CHECK CODEC AND METHOD OF THE SAME

(75) Inventors: Yeong-Luh Ueng, Kinmen County (TW); Yu-Lun Wang, Tainan (TW)

(73) Assignee: National Tsing Hua University, Hsinchu (TW)

( * ) Notice: Subject to any disclaimer, the term of this patent is extended or adjusted under 35 U.S.C. 154(b) by 354 days.

(21) Appl. No.: 12/870,226

(22) Filed: Aug. 27, 2010

(65) Prior Publication Data

US 2011/0161770 A1    Jun. 30, 2011

(30) Foreign Application Priority Data

Dec. 31, 2009   (TW) .............................. 98146070 A

(51) Int. Cl.
*H03M 13/00*    (2006.01)
(52) U.S. Cl. ........................................ 714/758; 714/799
(58) Field of Classification Search .................. 714/758, 714/799

See application file for complete search history.

(56) References Cited

U.S. PATENT DOCUMENTS

| 2003/0229843 A1* | 12/2003 | Yu et al. | 714/794 |
| 2004/0034827 A1* | 2/2004 | Shen et al. | 714/758 |
| 2005/0210367 A1* | 9/2005 | Ashikhmin et al. | 714/801 |
| 2005/0229087 A1* | 10/2005 | Kim et al. | 714/800 |
| 2010/0005363 A1* | 1/2010 | Eroz et al. | 714/755 |

* cited by examiner

*Primary Examiner* — M. Mujtaba K Chaudry
(74) *Attorney, Agent, or Firm* — Muncy, Geissler, Olds & Lowe, PLLC

(57) ABSTRACT

The present invention provides a low-complexity and multi-mode Low-density Parity-check (LDPC) codec, in which the decoding operations are divided into small tasks and a unified hardware is implemented so that the hardware resources can be reused in different modes. In addition, memory access is achieved via routing networks with fixed interconnections and memory address generators, the complexity of the hardware implementation is reduced accordingly. Further, the present invention provides an early termination function with which the iterative operations can be terminated early when a threshold is reached so that the power consumption can be thus reduced. The hardware resources for early termination shares a part of hardware resources with an encoder according to the present invention so that the complexity of the hardware implementation can also be reduced.

8 Claims, 18 Drawing Sheets

$$H = \begin{bmatrix} P_{0,0} & P_{0,1} & P_{0,2} & \cdots & P_{0,Nb-2} & P_{0,Nb-1} \\ P_{1,0} & P_{1,1} & P_{1,2} & \cdots & P_{1,Nb-2} & P_{1,Nb-1} \\ P_{2,0} & P_{2,1} & P_{2,2} & \cdots & P_{2,Nb-2} & P_{2,Nb-1} \\ \vdots & \vdots & \vdots & \vdots & \vdots & \vdots \\ P_{Mb-1,0} & P_{Mb-1,1} & P_{Mb-1,2} & \cdots & P_{Mb-1,Nb-2} & P_{Mb-1,Nb-1} \end{bmatrix} = P^{Hb}$$

Fig. 1 (PRIOR ART)

$$\begin{bmatrix} 1 & -1 & -1 & -1 & 2 \\ 2 & -1 & -1 & 0 & -1 \\ -1 & -1 & 2 & -1 & -1 \\ -1 & 2 & -1 & -1 & -1 \\ -1 & -1 & 0 & -1 & 2 \\ 1 & -1 & 0 & -1 & 1 \\ 0 & 0 & -1 & -1 & -1 \\ -1 & 0 & 0 & -1 & -1 \\ -1 & -1 & 0 & 0 & -1 \\ -1 & -1 & -1 & 0 & 0 \end{bmatrix}$$

| | | | |
|---|---|---|---|
| -1 | -1 | 0 | 0 |
| -1 | 0 | 0 | -1 |
| 0 | 0 | -1 | -1 |
| 80 | 0 | -1 | 80 |
| 77 | 0 | 15 | 66 |
| 4 | 49 | 67 | 11 |
| 20 | 44 | 88 | 92 |
| 36 | 0 | 60 | 84 |
| 0 | 72 | 78 | 30 |
| 5 | 14 | 86 | 57 |
| 33 | 71 | 9 | 92 |
| 82 | 12 | 81 | 29 |
| 52 | 21 | 61 | 90 |
| 86 | 41 | 91 | 53 |
| 8 | -1 | 24 | 20 |
| 84 | 47 | 31 | 11 |
| 91 | 79 | -1 | 10 |
| -1 | 12 | 21 | 13 |
| 7 | 47 | -1 | 36 |
| 47 | 40 | 67 | -1 |
| -1 | 36 | 4 | 15 |
| 55 | -1 | 83 | 50 |
| 25 | 6 | 81 | -1 |
| 1 | -1 | 51 | 50 |

$$H = \begin{bmatrix} 0 & 0 & 1 & 0 & 0 & 1 & 0 & 0 & 1 \\ 0 & 1 & 0 & 0 & 1 & 0 & 0 & 1 & 0 \\ 1 & 0 & 0 & 1 & 0 & 0 & 1 & 0 & 0 \\ 1 & 0 & 0 & 0 & 1 & 0 & 0 & 0 & 1 \\ 0 & 0 & 1 & 1 & 0 & 0 & 0 & 1 & 0 \\ 0 & 1 & 0 & 0 & 0 & 1 & 1 & 0 & 0 \end{bmatrix}$$

Fig.4A (PRIOR ART)

Fig.5A $$H_0 = \begin{bmatrix} \underbrace{\phantom{xxxxxxxx}}_{A} & \underbrace{\phantom{xxxxxx}}_{B} & \underbrace{\phantom{xxxxxx}}_{C} \end{bmatrix}$$

LOW DENSITY PARITY CHECK CODEC AND METHOD OF THE SAME

FIELD OF THE INVENTION

The present invention relates to a low density parity check (LDPC) codec and particularly to a low-complexity and multi-mode LDPC codec and a method of the same.

BACKGROUND OF THE INVENTION

The LDPC (Low-Density Parity-Check) code is an error correction code applied in encoding/decoding of message transmissions in noisy channels of communication. An LDPC code C is defined by a sparse parity-check matrix (abbreviated as PCM thereafter) H. The "low-density" in LDPC is attributed to that the density of "1s (ones)" in the PCM H corresponding to an LDPC code is low. This characteristic of "low density" enables the low complexity of decoding operations. The LDPC code has a superior error correction efficacy and is thus widely used in channel encoding techniques in the next generation of communication systems, for example, WiMAX (Worldwide Interoperability for Microwave Access).

The WiMAX standard adopts QC-LDPC (quasi-cyclic LDPC) codes, which are block-type error correction codes. When defining a QC-LDPC code C, it usually requires the definition of a PCM H corresponding to the QC-LDPC code. H can be represented as an M×N (M by N) matrix, which can be expanded from an $M_b \times N_b$ binary base matrix $H_b$, wherein $M=z \times M_b$ and $N=z \times N_b$, and z is a positive integer called the expansion factor. In matrix $H_b$, each "0 (zero)" can be replaced by a z×z zero matrix, and each "1 (one)" can be replaced by a z×z permutation matrix. The z×z permutation matrix is obtained via cyclically right shifting an identity matrix. FIG. 1 shows the presentation of a parity-check matrix H, wherein $P_{ij}$ can be a z×z permutation matrix or a z×z zero matrix, and wherein i and j of matrix $H_b$ are respectively the row index and the column index.

As each permutation matrix is obtained via cyclically right shifting an identity matrix, a binary base matrix and the shift indices of the permutation matrices can be integrated to form a concise prototype matrix $H_{bm}$. The prototype matrix $H_{bm}$ has the same dimension as the binary base matrix $H_b$ does. Each "0 (zero)" of the binary base matrix $H_b$ is replaced by a blank or a negative value, such as "−1", representing a zero matrix completely formed of zeros, and each "1 (one)" of the binary base matrix $H_b$ is replaced by the displacement value of the cyclic right shifts. The prototype matrix $H_{bm}$ can be directly expanded to obtain a parity-check matrix H. FIG. 2A and FIG. 2B respectively show examples of a prototype matrix $H_{bm}$ and a parity-check matrix H. In FIG. 2B, $0_{3 \times 3}$ expresses a 3×3 zero matrix.

The WiMAX standard includes six types of code rates or classes: 1/2, 2/3A, 2/3B, 3/4A, 3/4B and 5/6, and respectively provide one prototype matrix for each of the code class. Therefore, there are totally six different prototype matrices in the WiMAX standard. FIG. 3 shows the prototype matrix $H_{bm}$ with the expansion factor z being 96 and the code rate being 5/6. In the WiMAX standard, each class includes 19 different QC-LDPC codes with different code lengths respectively. The code lengths are respectively determined by 19 different expansion factors z, including 24, 28, 32, . . . , and 96. The code length can be represented by 24 z. Accordingly, the WiMAX totally has 114 (=6×19) types of QC-LDPC codes.

In the WiMAX standard, each prototype matrix is assigned by the code rate. In other words, an LDPC code is assigned by parameters of the code rate and the code length. Therefore, it is an important subject to simplify the hardware implementation via designing a flexible hardware architecture, whereby most of the hardware resources can be re-used in different WiMAX modes.

An LDPC code is usually graphically expressed by a Tanner graph. The Tanner graph is a bipartite graph. FIG. 4A and FIG. 4B respectively show an LDPC code and the Tanner graph corresponding to the LDPC code. Each row of a PCM H is corresponding to a check node, and each column thereof is corresponding to a variable node. The PCM H in FIG. 4A has six rows and nine columns. Thus, the corresponding Tanner graph has nine variable nodes in the top layer and six check nodes in the bottom layer, wherein the numbers in the circles and squares respectively represent the column indices and the row indices. When an element (i, j) in the PCM H is 1, there is an edge connecting the $i^{th}$ check node and the $j^{th}$ variable node.

The error correction efficiency of the LDPC code positively correlates with the number of iterations. A noisier channel thus requires a greater number of iterations to improve the BER (Bit Error Rate) performance. For increasing the throughput of a partially-parallel decoder, it is necessary to decrease the number of the processing cycles of a single iteration or the number of iterations to achieve a given BER. A conventional overlapped decoding technology can reduce the number of the processing cycles via scheduling the operations of the check nodes and variable nodes to concurrently undertake some operations of them. Further, in a conventional TPMP (Two Phase Message Passing) decoding technology, the variable nodes can only use the C2V (check to variable) messages generated in the preceding iteration to undertake the updates. Thus, a greater number of iterations is required to obtain a given BER performance.

SUMMARY OF THE INVENTION

One objective of the present invention is to provide a low-complexity and multi-mode LDPC codec and a method of the same, wherein the encoding and decoding operations are partitioned into layers, sub-layers and tasks, and wherein the quasi-cyclic structure of the LDPC codes enables the LDPC codes with different code rates and different code lengths to share the hardware resources, whereby reducing the complexity in hardware implementation.

Another objective of the present invention is to provide an LDPC codec and a method of the same to reduce the number of iterations, wherein the messages generated in an identical iteration can be used to update other messages, whereby a given BER performance can be achieved with only about one half of the number of iterations.

A further objective of the present invention is to provide an LDPC codec and a method of the same, which provides an early termination function, wherein the early termination function is able to reduce the unnecessary decoding operations and compatible with the layered decoding, thus reducing the power consumption of the system. Also, the early termination circuit in the codec architecture shares a part of the hardware resources with an encoder according to the present invention, whereby decreasing the complexity in hardware implementation.

According to one embodiment, the method for encoding and decoding an LDPC code of the present invention comprises the steps of: partitioning a PCM of an LDPC code into a plurality of layers in a row-permutation manner; partitioning each of the layers into a plurality of sub-layers by rows; partitioning each of the sub-layers into a plurality of tasks in an out-of-order manner, wherein each of the layers comprises the tasks; processing the tasks of each layer in a sequential manner. Since the tasks are taken to be the processing units, the present invention can be applied to different classes and different code lengths of the WiMAX standard.

According to one embodiment, the LDPC codec of the present invention comprises a plurality of address generators; a first storage device accessing the addresses supplied by the corresponding address generators; a first routing network; a second routing network; a plurality of processing units connected to the corresponding first storage device via the first routing network to perform an iterative decoding operation, wherein each of the processing units produces a plurality of decoding operation output values fed back and stored in the first storage device via the second routing network.

The present invention further comprises an early termination circuit, which computes the operation value from the iterative decoding operation and early terminates the iterative decoding operation if the output value of the calculation satisfies a given limit, whereby the number of iterations is decreased and the power consumption is reduced. The present invention further comprises an encoder sharing a part of hardware resources with the early termination circuit, whereby simplifying the hardware implementation.

BRIEF DESCRIPTION OF THE DRAWINGS

The embodiments of the present invention are described in cooperation with the following drawings to make an easy understanding of the objectives, characteristics and advantages of the present invention.

FIG. 1 is a diagram showing a quasi-cyclic parity-check matrix H;

FIG. 2A and FIG. 2B are diagrams respectively showing a prototype matrix $H_{bm}$ and a parity-check matrix H;

FIG. 3 is a diagram showing a prototype matrix with the expansion factor z being 96 and the code rate being 5/6 in the WiMAX standard;

FIG. 4A and FIG. 4B are diagrams respectively showing an LDPC code and the Tanner graph corresponding to the LDPC code;

FIG. 5A is a diagram showing three sub-matrices $H_0'$, $H_1'$, and $H_2'$ obtained via rearranging the PCM shown in FIG. 2B with LMPD-ICM;

FIG. 5B is a diagram showing a core matrix $H_0$ corresponding to the matrix $H_0'$ shown in FIG. 5A obtained by removing the zero columns from $H_0'$;

FIG. 7 is a diagram showing a prototype matrix for the WiMAX LDPC code with the expansion factor z being 24 and the code rate being 5/6, and the five corresponding tasks determined by a computer search;

DETAILED DESCRIPTION OF THE PREFERRED EMBODIMENTS

Figure 4B:
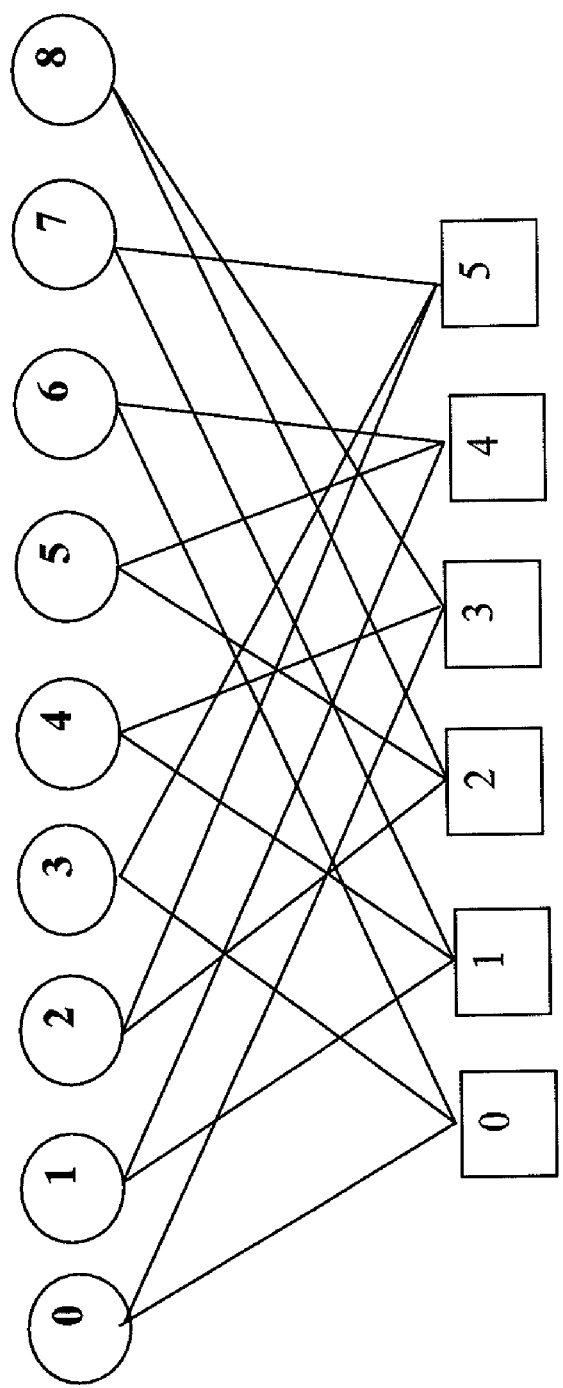

The embodiments are used to exemplify the present invention. However, the persons skilled in the art should understand that the embodiments are not intended to limit the scope of the present invention, and that any equivalent modification or variation according to the spirit of the present invention is to be also included within the scope of the present invention. The preset invention is divided into several parts for the convenience of description and demonstration. However, it neither means that the present invention should be practiced according to the division nor implies that the present invention should be realized via a combination of the parts. The present invention is exemplified by the applications of WiMAX. However, the present invention does not limit its applications to WiMAX merely.

[LMPD-ICM and Tasks]

The present invention adopts an improved layered decoding technology—Layered message passing decoding (LMPD) using an identical core matrix (ICM) to achieve a fast convergence speed in BER performance and realize the multi-mode functionality, such as 114 QC-LDPC codes adopted in the WiMAX standard.

Figure 2B:
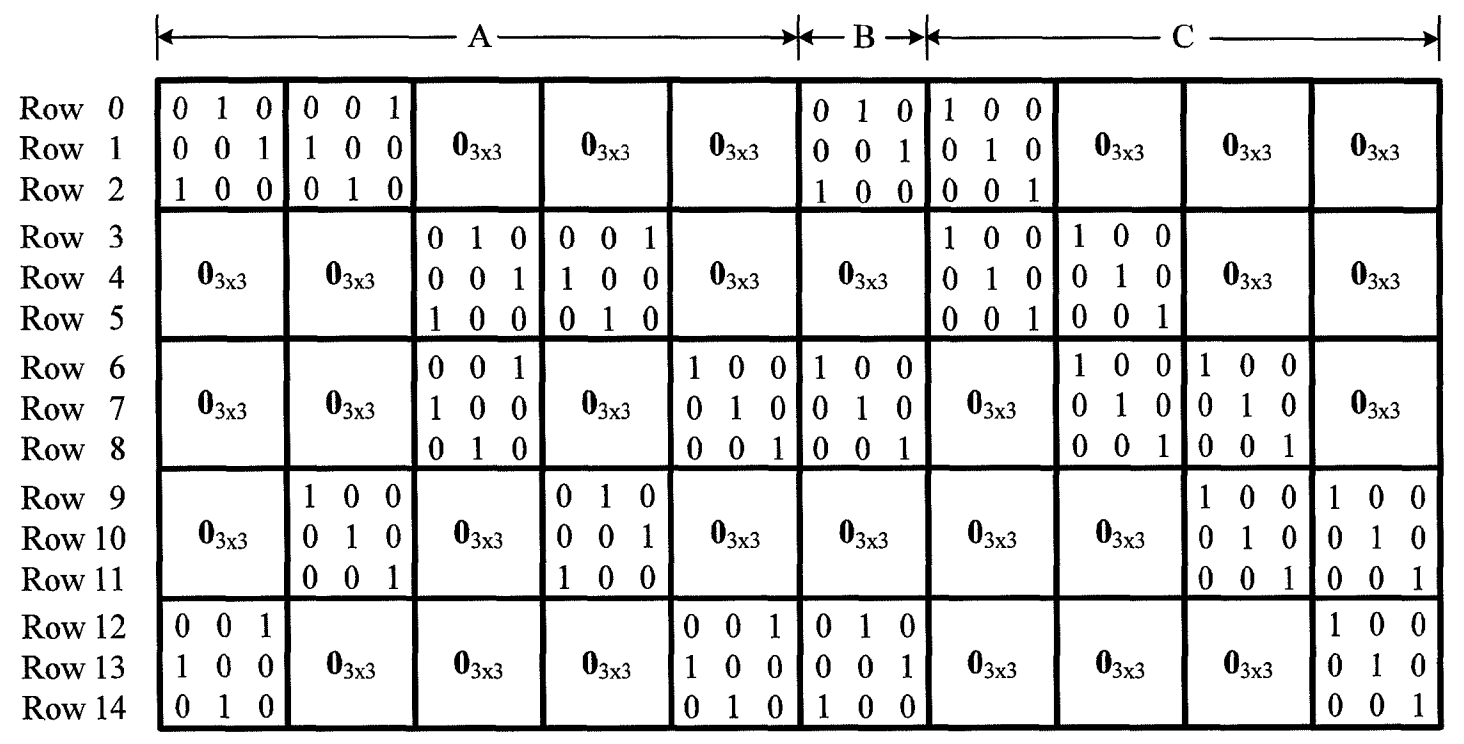
Figure 5A:
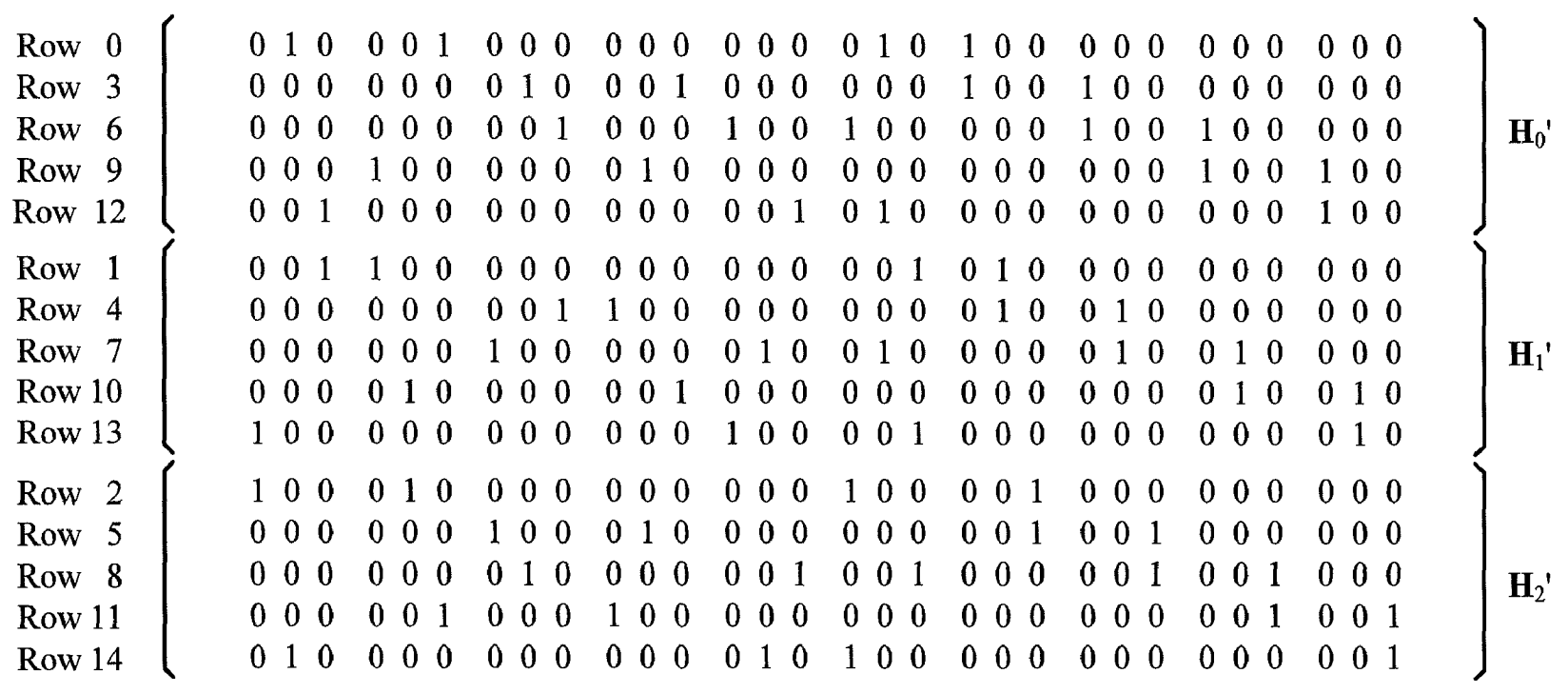

According to the LMPD-ICM of the present invention, the row of the PCM H of a QC-LDPC code C is partitioned into z layers in a row-permutation manner. The $l^{th}$ layer is denoted with $H_l'$ including the $l^{th}$ row, the $(z+l)^{th}$ row, . . . , and the $((M_b-1)z+l)^{th}$ row of the PCM H, wherein $0 \leq l < z$, and $M_b$ is the number of the rows of a binary base matrix $H_b$. The above-mentioned layering method is only an embodiment of the present invention. The present invention does not limit layering to the above-mentioned method. In another embodiment, the $l^{th}$ layer of $H_l'$ includes the $((l+a_0) \mod(z))^{th}$ row, the $(z+(l+a_1) \mod(z))^{th}$ row, . . . , and the $((M_b-1)z+(l+a_{Mb-1}) \mod(z))^{th}$ row of the PCM H, wherein $0 \leq l < z$, and wherein $a_0, a_1, \ldots,$ and $a_{Mb-1}$ are selected from non-negative integers, and wherein $M_b$ is the number of the rows of a binary base matrix of the PCM. Further, the zero columns in the matrix $H_l'$ are removed and the core matrix $H_l$ of the $l^{th}$ layer is obtained. For example, rearrange the PCM H shown in FIG. 2B and obtain the three matrices $H_0'$, $H_1'$, and $H_2'$ shown in FIG. 5A. The matrix $H_0'$ includes the $0^{th}$, $3^{rd}$, $6^{th}$, $9^{th}$, and $12^{th}$ rows of the original PCM H, and $H_1'$ and $H_2'$ can be obtained in the same way. Remove the zero columns in the matrix $H_0'$ and obtain the core sub-matrix $H_0$ shown in FIG. 5B. The core matrices $H_1$ and $H_2$ can be obtained in the same way from $H_1'$ and $H_2'$, respectively.

The layering method of LMPD-ICM is to simplify the PCM of a QC-LDPC code and reduce the hardware allocation for processing and storage. The acquired $H_l$ is a concise form derived from the code bits of a QC-LDPC code. It should be noted that $0 \leq l < z$ and the core matrices $H_l$ are the column-permuted versions to each other. Although the row permutation is undertaken in the LMPD-ICM, the simplification or rearrangement of the PCM H does not affect decoding since the order of the rows in the PCM H has nothing related to decoding.

For the WiMAX standard, the LDPC codes of an identical class have almost same core matrices. Thus, the 19 LDPC codes of an identical class can share identical routing networks. Thereby, the present invention can simplify the routing networks, and all the layers can share the identical routing networks. It is found from the core sub-matrix in FIG. 5B that the dual-diagonal structure of the prototype matrix is preserved (appearing in the entire Part C and the last column of Part B). Such a feature benefits the application of layered encoding which will be demonstrated later.

The implementation of the LDPC codec of the present invention is based on the above-mentioned LMPD-ICM technology. Table 1 lists the parameters of the six classes of WiMAX LDPC codes. It shows that the layers of different classes respectively have different numbers of rows. In other words, the layer sizes are different in different classes. In order to re-use the hardware, the layer sizes of different classes of the WiMAX standard should be unified. The present invention selects the smallest layer size, i.e. size "4", from all the classes as the standard size. For the class having a layer size greater than 4, the layer is further partitioned into sub-layers according to the smallest layer size "4". Thereby, the sizes of all the sub-layers of all the classes are no more greater than 4. For the class of code rate 5/6, the layer size of the layers is exactly 4, and the sub-layers are thus identical to the layers.

Figure 6:
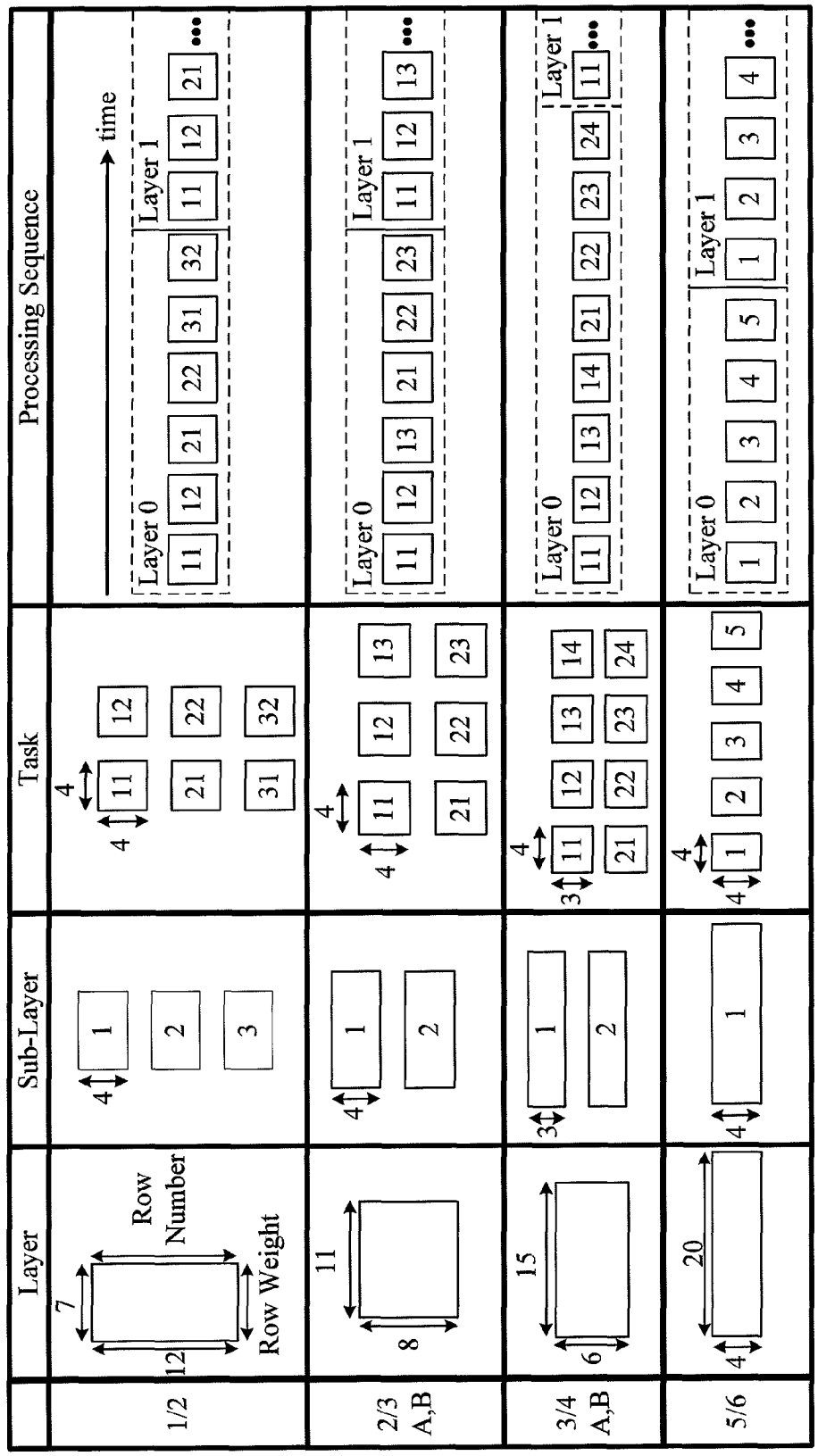
FIG. 6 is a diagram showing the layers, sub-layers, tasks and processing sequences of different classes of the WiMAX LDPC codes.

FIG. 6 shows the layers, sub-layers, tasks and processing sequences of different classes of WiMAX LDPC codes. For the class with code rate of 1/2, the prototype matrix $H_{bm}$ thereof is a 12×24 matrix. Perform the layering method of LMPD-ICM on the PCM H and delete the zero columns, a core matrix can be obtained. Further delete the elements of "0" in the core matrix and obtain a layer sized about 12×7. For the class with code rate of 1/2, the row number of a core matrix thereof is 12, which is greater than the standard size 4. Then, partition the layer into sub-layers according to the standard size 4, and each sub-layer has four rows. Thus, a 12×7 layer matrix can be partitioned into three 4×7 sub-layer matrices. In FIG. 6, the numbers in the sub-layers, tasks and processing sequences shown are their corresponding indices.

TABLE 1

Parameters for Different Code Classes

| Code Rate | 1/2 | 2/3A{B} | 3/4A{B} | 5/6 |
|---|---|---|---|---|
| Row Weights | {6, 7} | A: {10}<br>B: {10, 11} | {14, 15} | {20} |
| Number of Rows for Each Layer | 12 | 8 | 6 | 4 |
| Number of Sub-layers for Each Layer | 3 | 2 | 2 | 1 |
| Decoding Parallelism | 4 | 4 | 3 | 4 |
| Number of Cycles Required to Process a Layer | 6 | 6 | 8 | 5 |

The row weight in Table 1 is the number of 1s corresponding to each row of the parity-check matrix. The numbers inside the brackets represent the set of the row weights. From Table 1 and FIG. 6, it is found that the row weights of various classes of WiMAX LDPC codes are close to the multiples of 4. Thus, "4" is selected as the standard to further partition the sub-layer into tasks. Thereby, the tasks of different classes have identical or similar sizes. Therefore, using tasks as the processing units enables all the classes of WiMAX LDPC codes to repeatedly use a unified hardware architecture. The complexity of the hardware architecture is accordingly reduced.

Refer to FIG. 6 for the explanation of dividing a layer into tasks. In the class with code rate of 1/2, a 4×7 sub-layer matrix is partitioned into two 4×4 task matrices according to the pre-determined task size, wherein the un-used task entries are assigned by a dummy element which does not affect the decoding operations. The other classes of WiMAX LDPC codes can also be partitioned similarly to obtain the tasks shown in FIG. 6.

FIG. 6 also shows the processing task sequences of various code rates of WiMAX. In the class of code rate 1/2, the processing task sequence of the $l^{th}$ layer task is Task 11, Task 12, Task 21, Task 22, Task 31 and Task 32. Then, Task 11 of the $(l+1)^{th}$ layer succeeds to the $l^{th}$ layer, and so on. Therefore, a layer needs 6 cycles to undertake operations. A total of 6 z cycles are needed to complete an iteration of the LDPC decoding for the class with code rate of 1/2, wherein z is the expansion factor.

Figure 7:
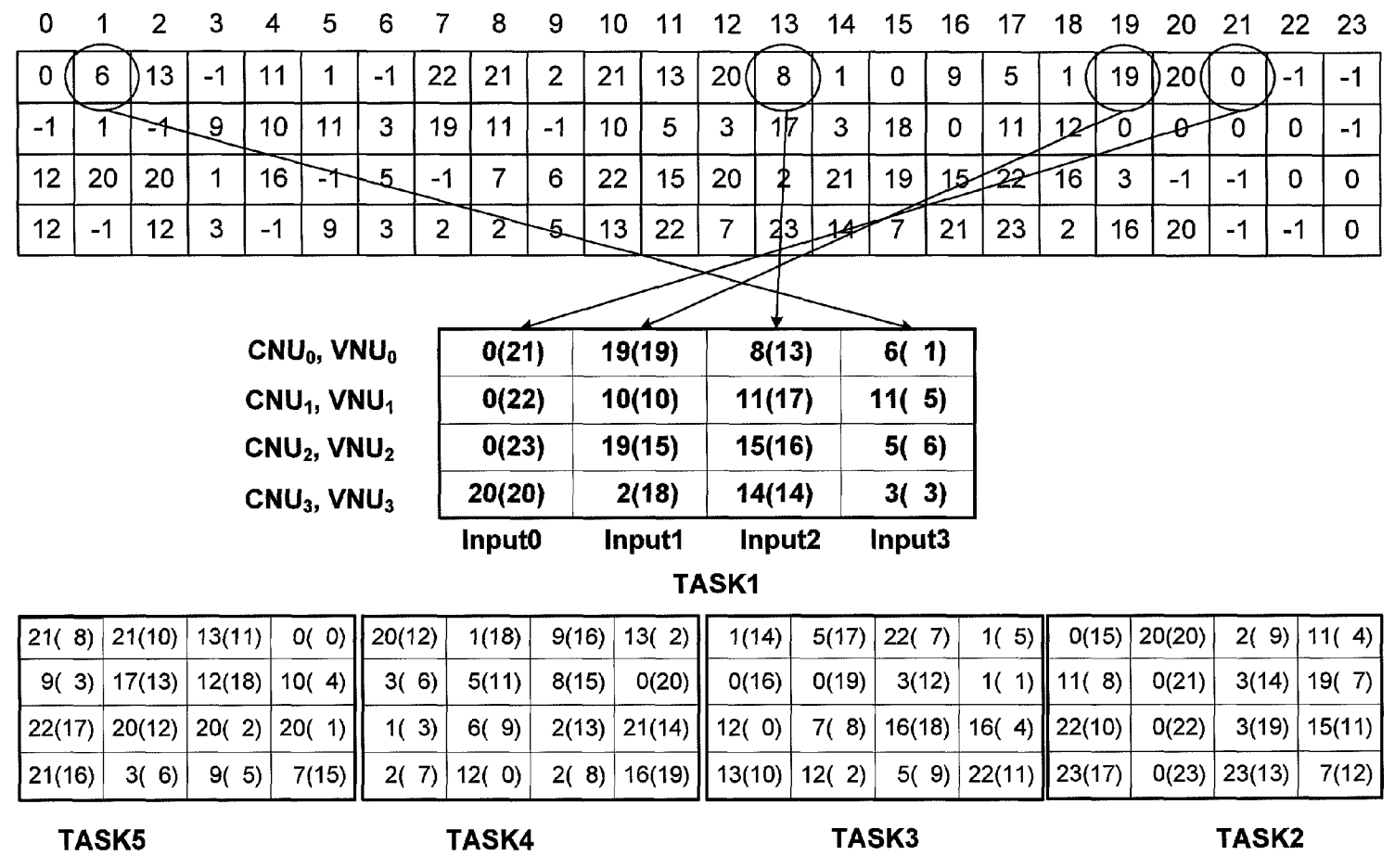

The hardware configuration should be taken into consideration in partitioning a sub-layer into tasks. Refer to FIG. 7. The prototype matrix $H_{bm}$ of code rate 5/6 and z=24 has 24 block columns. A memory block is used to store data of the corresponding block column. Therefore, there are total 24 memory blocks.

In FIG. 7, the 80 non-negative elements of the prototype matrix are divided into 5 groups (matrices), and each group (matrix) includes 16 non-negative elements. The reading of 16 pieces of values (more exactly the APP values which will be described in details later) of a task matrix should be completed within one cycle. However, one memory block can only provide one value within each cycle. Thus, the accesses of the 16 pieces of values are distributed to 24 memory blocks, which causes out-of-order processing shown by the arrows in FIG. 7. Generally, the arrangement of the tasks is undertaken by a computer. FIG. 7 also shows the five tasks for code rate 5/6 and z=24—TASK 1, TASK 2, TASK 3, TASK 4 and TASK 5.

[Expansion Factors]

In addition to the code rate, the expansion factor z is also a parameter in specifying an LDPC code in the WiMAX standard. There are total 19 expansion factors, including 24, 28, 32, . . . , and 96. Both the PCM's shown in FIG. 3 and FIG. 7 are LDPC codes with code rate 5/6 in the WiMAX standard. However, for the PCM shown in FIG. 7, the expansion factor z is 24, and the expansion factor z for the PCM shown in FIG. 3 is 96. In the WiMAX standard, the LDPC codes in the same code class have an identical code rate but different code lengths, the non-negative elements (i, j) of the prototype matrix can be calculated with Equation (1):

$$s(i, j, z) = \left\lfloor \frac{s(i, j, 96)z}{96} \right\rfloor \quad (1)$$

wherein s(i, j, 96) is the non-negative element at the $i^{th}$ row and the $j^{th}$ column of the prototype matrix of the LDPC code with code rate 5/6 when z=96, wherein z can be 24, 28, 32, . . . , or 96. Equation (1) can transform the matrix in FIG. 3 into the matrix in FIG. 7. For the LDPC codes with the other code rates, the prototype matrices having different code lengths also can be transformed in a similar way.

So far the transformation of the LDPC codes having different code lengths is described, the layering of a PCM H is achieved, and each layer is further divided into several tasks. Since the size of the tasks is fixed among different code rates, the decoding operations can be realized by sequentially executing a task sequence. A unified task processor can be designed to provide multi-mode decoding.

[Decoding Algorithm]

In the present invention, LMPD-OMSA (Layered Message Passing Decoding using Offset Min-Sum Algorithm) is adopted in the check node operations. However, the present invention does not limit the decoding to only using the above-mentioned algorithm. The spirit and principle of the present invention may also be realized with other algorithms.

Let $R_{ij}^{(k)}$ express the check-to-variable (C2V for short) message from the $i^{th}$ check node to the $j^{th}$ variable node, which is generated in the $k^{th}$ iteration. Similarly, let $Q_{ji}^{(k)}$ express the variable-to-check (V2C for short) message from the $j^{th}$ variable node to the $i^{th}$ check node, which is generated in the $k^{th}$ iteration. In LMPD, the rows (equivalent to the check nodes) of a PCM H are divided into L groups (layers), and each group includes $M_L$ rows. Thus, $L \times M_L = z \times M_b$. Firstly, initialize C2V's $R_{ij}^{(0)}$ to be zero for all i's and all j's that belong to $I_R(i)$ (j∈ $I_R(i)$), wherein $I_R(i)$ is an index set of the variable nodes connected with the check node i. Next, sequentially undertake the check-node operations and the variable-node operations for the $0^{th}$, $1^{st}$, $2^{nd}$, ..., and $(L-1)^{th}$ layers to complete an iteration. Thereby, the LMPD can utilize the C2V messages generated by the earlier layers in the $k^{th}$ iteration to update the V2C message $Q_{ji}^{(k)}$ calculated in a later layer in the same iteration. Therefore, comparing with TPMP algorithm, LMPD can achieve a given BER performance with only about a half number of iterations. More details will be described later.

In the $k^{th}$ iteration of LMPD, the check-node operations and the variable-node operations of the $l^{th}$ layer are described below.

1. The variable-node operations of the $l^{th}$ layer:

In the $l^{th}$ layer, the check nodes i are included, where $l \times M_L \leq i < (l+1) \times M_L$. Each V2C message $Q_{ij}^{(k)}$ related to these $M_L$ check nodes is computed from Equation (2):

$$Q_{ji}^{(k)} = \lambda_j + \sum_{\substack{i' \in I_C(j) \\ i' < l \cdot M_L}} R_{i'j}^{(k)} + \sum_{\substack{i' \in I_C(j) \setminus i \\ i' \geq l \cdot M_L}} R_{i'j}^{(k-1)} \quad (2)$$

wherein $\lambda_j$ is the reliability value of the variable node j, and $I_c(j)$ is the index set of the check nodes connected to the variable node j.

2. The check-node operations of the $l^{th}$ layer:

In the $l^{th}$ layer, each V2C message $R_{ij}^{(k)}$ is computed from Equation (3):

$$R_{ij}^{(k)} = S_{ij}^{(k)} \cdot \max\left\{\min_{j' \in I_R(i) \setminus j} |Q_{j'i}^{(k)}| - \beta, 0\right\} \quad (3)$$

wherein β is a non-negative constant value, and $$S_{ij}^{(k)} = \prod_{j' \in I_R(i) \setminus j} \text{sgn}(Q_{j'i}^{(k)}) \quad (4)$$

wherein sgn is a sign function.

At the end of the $k^{th}$ iteration, $\Lambda_j^{(k)}$—the APP (A Posteriori Probability) $\Lambda_j^{(k)}$ of the $j^{th}$ bit (variable node) is computed from Equation (5):

$$\Lambda_j^{(k)} = \lambda_j + \sum_{i' \in I_C(j)} R_{i'j}^{(k)} \quad (5)$$

Combining Equations (5) and (2), we can obtain Equation (6):

$$Q_{ji}^{(k)} = \Lambda_j^{(k-1)} - R_{ij}^{(k-1)} + \sum_{\substack{i' \in I_C(j) \\ i' < l \cdot M_L}} \left[ R_{i'j}^{(k)} - R_{i'j}^{(k-1)} \right] \quad (6)$$

Let $$\Lambda_{j,l-1}^{(k)} = \Lambda_j^{(k-1)} + \sum_{\substack{i' \in I_C(j) \\ i' < l \cdot M_L}} \left[ R_{i'j}^{(k)} - R_{i'j}^{(k-1)} \right].$$

Thus, Equation (6) can be simplified into Equation (7):

$$Q_{ji}^{(k)} = \Lambda_{j,l-1}^{(k)} - R_{ij}^{(k-1)} \quad (7)$$

The hardware implementation for LMPD can be constructed according to the above discussion. The variable-node operations and check-node operations of the $l^{th}$ layer can be performed respectively according to Equation (7) and Equations (3) and (4). For the $k^{th}$ iteration of the $l^{th}$ layer, the $\Lambda_{j,l}^{(k)}$ value can be computed from Equation (8):

$$\Lambda_{j,l}^{(k)} = \Lambda_{j,l-1}^{(k)} + \sum_{\substack{i' \in I_C(j) \\ l \cdot M_L \leq i' < (l+1) \cdot M_L}} \left[ R_{i'j}^{(k)} - R_{i'j}^{(k-1)} \right] \quad (8)$$

In the $l^{th}$ layer, if a specified variable node j is only connected with a check node i, Equation (8) can be simplified into Equation (9):

$$\Lambda_{j,l}^{(k)} = Q_{ji}^{(k)} + R_{ij}^{(k)} \quad (9)$$

Similarly, if a specified variable node j is only connected with two check nodes $i_1$ and $i_2$ in the $l^{th}$ layer, Equation (8) can be simplified into Equation (10):

$$\Lambda_{j,l}^{(k)} = \Lambda_{j,l-1}^{(k)} - R_{i_1 j}^{(k-1)} - R_{i_2 j}^{(k-1)} + R_{i_1 j}^{(k)} + R_{i_2 j}^{(k)} \quad (10)$$

[Overview of Hardware Architecture]

Figure 8:
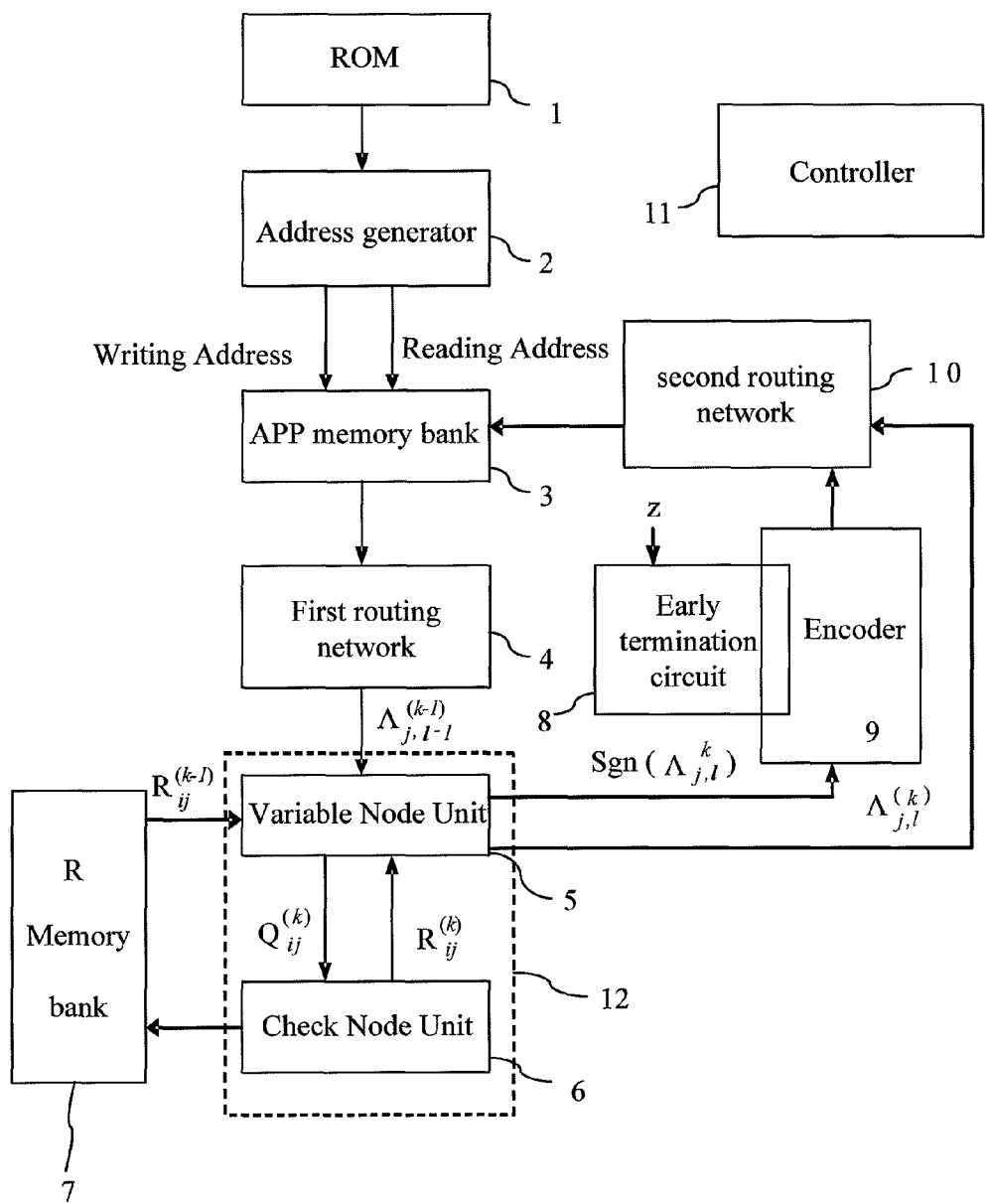
FIG. 8 is a block diagram schematically showing the hardware architecture according to one embodiment of the present invention.

FIG. 8 is a block diagram schematically showing hardware architecture according to one embodiment of the present invention. FIG. 8 is not intended to limit the scope of the present invention but only used to demonstrate one embodiment of the present invention. FIG. 8 does not present the exact numbers of the functional blocks but only demonstrates the hardware functions schematically.

As shown in FIG. 8, the codec architecture of the present invention comprises an address ROM (read-only memory) 1. The address ROM 1 stores information about task arrangement for APP memory access. Initially, the information is loaded from the address ROM 1 to the address generators 2. The address generators 2 automatically generate required addresses to read/write the associated APP values from/to the APP memory bank 3. The APP memory bank 3 is a first storage device comprising a plurality of memory blocks. The address ROM 1 is a second storage device used to store initial addresses needed by the APP memory blocks of the APP memory bank 3, the first storage device. Based on the quasi-cyclic structure and the LMPD-ICM, the same class of LDPC codes shares the same routing networks. For example, as shown in FIG. 8, a first routing network 4 is connected with a corresponding VNU (Variable Node Unit) 5. In the VNU 5, the $\Lambda_{j,l-1}^{(k)}$ value read from the APP memory bank 3 and $R_{ij}^{(k-1)}$ generated in the preceding iteration are used to compute $Q_{ji}^{(k)}$ according to Equation (7). A CNU (Check Node Unit) 6 uses the worked out $Q_{ji}^{(k)}$ to compute the required $R_{ij}^{(k)}$ according to Equations (3) and (4) and store the $R_{ij}^{(k)}$ into the R memory bank 7. The details will be described later. The VNU 5 also works out the $\Lambda_{j,l}^{(k)}$ value according to Equation (8) and writes the $\Lambda_{j,l}^{(k)}$ value into the corresponding memory block in the APP memory bank 3 via a second routing network 10. In FIG. 8, the combination of the VNU 5 and the CNU 6, which are encircled by a dotted rectangle line, may be regarded as a processing unit 12.

The codec architecture of the present invention also comprises an early termination circuit 8, and a termination threshold is input to the early termination circuit 8. For example, as shown in FIG. 8, an expansion factor z is functioned as the termination threshold. When the termination condition is satisfied, a controller 11 is used to early terminate the decoding operations. The early termination circuit 8 and an encoder 9 of the invention jointly share a portion of the hardware resources. Thereby, the complexity of hardware implementation is decreased, and the power consumption is reduced. The details will be described later.

[Address Generator and APP Memory]

As shown in FIG. 6, in rate 5/6, the five tasks Task 1, Task 2, Task 3, Task 4, and Task 5 are processed in sequence when the $l^{th}$ layer is operated, and then Task 1, Task 2, ..., of the $(l+1)^{th}$ layer are processed, and so on. Based on the quasi-cyclic characteristic of the PCM, Task 1 of the $l^{th}$ layer and Task 1 of the $(l+1)^{th}$ layer come from different addresses of the same memory block of the APP memory bank 3. Refer to FIG. 7 for an example. In the $0^{th}$ row of Task 1 of the $0^{th}$ layer, the APP value in the $6^{th}$ address of the $1^{st}$ block (denoted by 6(1)) of the APP memory bank 3 has to be accessed and assigned to the Input 3 of $VNU_0$. For the $1^{st}$ layer, the Input 3 of $VNU_0$ is assigned by the APP value positioned at the address shifted from the above-mentioned address by one unit in the same memory block of the APP memory bank 3. In other words, the $7^{th}$ address of the $1^{st}$ block of the APP memory bank 3 has to be accessed. The above-mentioned principle is also applied to other similar cases.

Summarize the above discussion as follows. Suppose the initial address of an APP value associated with the $0^{th}$ layer is s(j), which means the address s of the $j^{th}$ memory block. Based on the quasi-cyclic characteristic of the LDPC codes in the WiMAX standard, the address of the APP value associated with the $l^{th}$ layer corresponding to the same task entry can be expressed in a general form of (s(j)+l)mod(z), wherein mod means a module operation. It has to be noted that when the expansion factor z changes, only the initial address varies with the change of the expansion factor, and the index j of the memory block remains unchanged.

Figure 9:
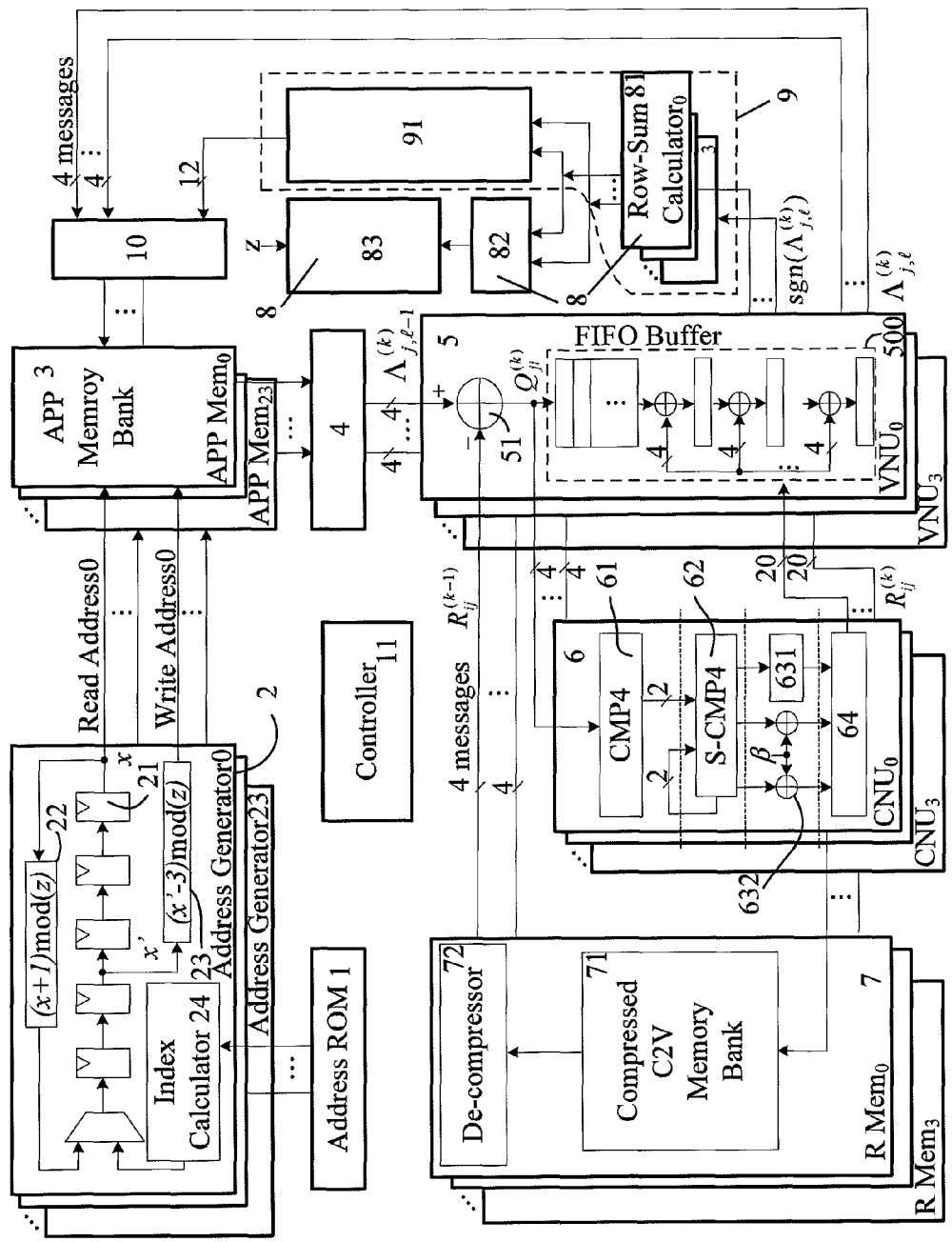
FIG. 9 is a block diagram schematically showing one embodiment that the hardware architecture of the present invention is applied to a case of code rate 5/6.

FIG. 9 is a block diagram schematically showing one embodiment that the present invention is applied to a case of code rate 5/6. The address generators 2 and the APP memory bank 3 are respectively shown in the left and middle of the upper region of FIG. 9. The APP memory bank 3, which consists of 24 APP memory blocks, is a storage device. Refer to FIG. 7 again. The prototype matrix of code rate 5/6 has 24 columns, and each column needs a memory block to store the corresponding data. Therefore, the APP memory bank 3 in FIG. 9 includes 24 memory blocks, which are designated as APP $Mem_i$, wherein $0 \leq i < 24$. Each memory block of the APP memory bank 3 is used to store the APP values of a corresponding block column of PCM. The read/write access for the 24 memory blocks of the APP memory bank 3 is controlled by the 24 address generators 2, which are designated as Address $Generator_i$, wherein $0 \leq i < 24$. The 16 APP values $\Lambda_{j,l-1}^{(k)}$ associated with a task can be read from the APP memory bank 3 via the corresponding address generators 2 and the first routing network 4. The VNU 5 and CNU 6 process the 16 APP values $\Lambda_{j,l-1}^{(k)}$, update $\Lambda_{j,l-1}^{(k)}$ to be $\Lambda_{j,l}^{(k)}$, and write $\Lambda_{j,l}^{(k)}$ into the APP memory bank 3 via the second routing network 10.

Refer to FIG. 6 again. In the case of code rate 5/6, processing a layer needs 5 cycles, and an iteration of code rate 5/6 needs 5 z cycles, wherein z is the expansion factor. Therefore, each address generator 2 in FIG. 9 includes a 5-stage shift register 21.

According to the above discussion and based on the quasi-cyclic characteristic of the LDPC code in the WiMAX standard, the addresses for the $l^{th}$ layer can be deduced from the address s(j) of the $0^{th}$ layer and expressed as (s(j)+l)mod(z), wherein mod means a module function. Refer to FIG. 9 for an example. A 5-stage shift register 21 outputs an address x to the corresponding APP memory block of the APP memory bank 3. At the same time, a calculation unit 22 performs a calculation of (x+1)mod(z) to obtain the address for the next (the original ordinal number plus 1) layer, and feeds back the new address to the input terminals of the 5-stage shift register 21.

Since the time difference of reading and writing of every task is maintained the same, the addresses for writing data to the APP memory bank 3 can be worked out from the information stored in some stages of the 5-stage shift register 21. In the modes of rate 5/6, the time difference is 12 clock cycles, which is two times greater than the cycles of processing a layer (5 registers). Therefore, a functional unit of (x'-3)mod(z) is used to compute a correct writing address. In FIG. 9, each address generator 2 includes a writing address unit 23. The latency of each writing address is 12. Therefore, an address x' is processed to obtain (x'-3)mod(z), which is used as the writing address for the APP memory bank 3. Each address generator 2 also has an index calculator 24, which computes the initial addresses of different expansion factors z according to Equation (1).

[CNU and VNU]

As shown in FIG. 6, a layer of code rate 5/6 has 4 rows, and each sub-layer also has 4 rows. In other words, the layer is identical to the sub-layer in the class of code rate 5/6. The number of rows in one sub-layer is the decoding parallelism. Therefore, the decoding parallelism is 4 for the class of code rate 5/6. The decoding parallelisms for the other code rates are listed in Table 1. The row weight of a PCM H of code rate 5/6 is 20. Therefore, each row is related to 20 V2C messages and 20 C2V messages. In each cycle, four V2C messages related to an identical row are sent to an identical CNU 6 and processed there. As the decoding parallelism is 4 in the class of code rate 5/6, four CNUs 6 are used to process four rows of each layer.

The embodiment that the present invention is applied to a case of code rate 5/6 is shown in FIG. 9. In this embodiment, there are four CNUs 6 designated by $CNU_i$, wherein $0 \leq i < 4$. In the four VNUs 5, the related APP values $\Lambda_{j,l-1}^{(k)}$ and C2V $R_{ij}^{(k)}$ are used to compute 16 V2C messages $Q_{ji}^{(k)}$. The $Q_{ji}^{(k)}$ values are respectively sent to four CNUs 6. Each CNU 6 can be pipelined into four stages. In the first stage, the absolute value of four V2Cs messages $|Q_{ji}^{(k)}|$ are sent to a four-input comparator unit 61 (CMP4 unit 61 for short). The CMP4 unit 61 has six comparators (not shown in the drawings). Each two of the four inputs are compared to find out the two minimums thereof. Thus $C_2^4=6$ comparators are involved.

In the second stage, a simplified CMP4 unit 62 (S-CMP4 unit 62 for short) that has only three comparators (not shown in the drawings) is used to find out the two minimums of $|Q_{ji}^{(k)}|$, the two absolute values of the V2C messages, in an iterative manner. Two values of the four inputs are derived from the feedback path from the output of the S-CMP4 unit 62 itself. As the four input values of the S-CMP4 unit 62 have been partially ordered, the number of the comparators of the S-CMP4 unit 62 is less than those used in the preceding stage.

In the third stage, a sign unit 631 is used to compute the sign of the new C2V messages $R_{ij}^{(k)}$ according to Equation (4). In this stage, the offset compensation of the two minimums generated by Equation (3) is simultaneously completed in two first subtractors 632. In this stage, the output is a compressed form of the 20 updated C2V messages $R_{ij}^{(k)}$ which is simultaneously sent to a corresponding compressed C2V memory bank 71 of an R memory bank 7 and stored there in a compressed format. When these C2V messages are required in the following iteration, the compressed updated C2V messages $R_{ij}^{(k)}$ are accessed from the C2V memory bank 71 and then decompressed by a decompressor 72. The number of memory blocks in the R memory bank 7 is equal to the decoding parallelism which is designated by R Mem$_i$, wherein $0 \leq i < 4$. In the last stage, the C2V calculator 64 simultaneously works out the 20 C2V messages $R_{ij}^{(k)}$ which are sent to the VNU 5 for updating the corresponding APP values.

Each CNU 6 iteratively compares the magnitudes of the 4 input V2C messages $Q_{ji}^{(k)}$, and computes the 20 corresponding C2V messages. Then, the 20 updated C2V messages $R_{ij}^{(k)}$ are simultaneously sent to the corresponding VNUs 5. As processing a layer needs five cycles, an iteration needs total 5 z cycles.

Refer to FIG. 9 again. In the embodiment that the present invention is applied to a case of code rate 5/6, there are four VNUs 5 designated by VNU$_i$, wherein $0 \leq i < 4$. In the second subtractor 51 of each VNU 5, the related APP values $\Lambda_{j,l-1}^{(k)}$ and C2V $R_{ij}^{(k-1)}$ are used to compute 16 V2C messages $Q_{ji}^{(k)}$ according to Equation (7). As mentioned above, the V2C messages $Q_{ji}^{(k)}$ are sent to the four CNUs 6. On the other hand, the V2C messages $Q_{ji}^{(k)}$ are also sent to the FIFO (First-In-First-Out) buffer 500 of every VNU 5 for performing the required variable-node operation.

Figure 10A:
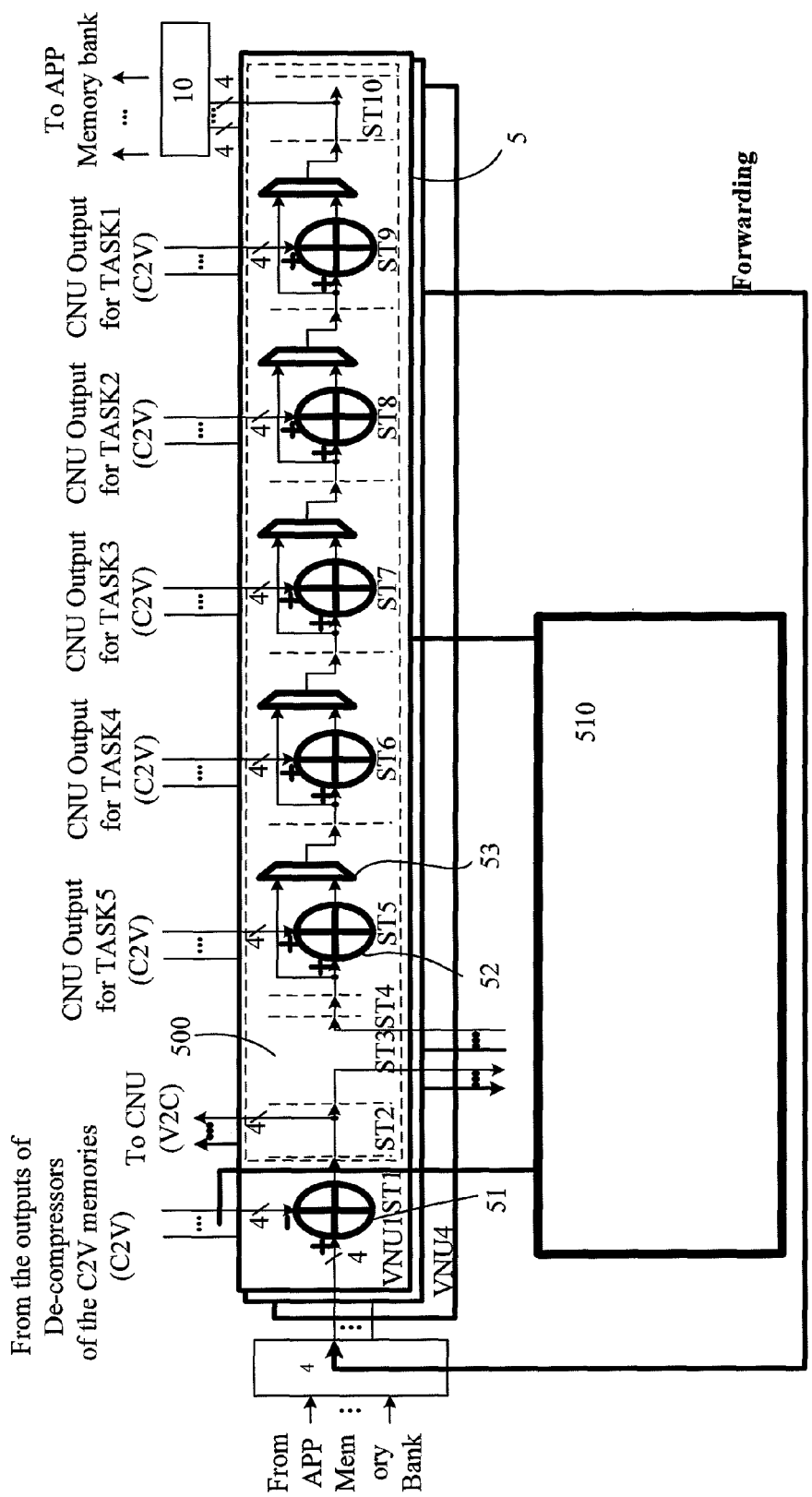
FIG. 10A is a diagram schematically showing the hardware architecture of a variable node processor (VNP) of the present invention.
Figure 10B:
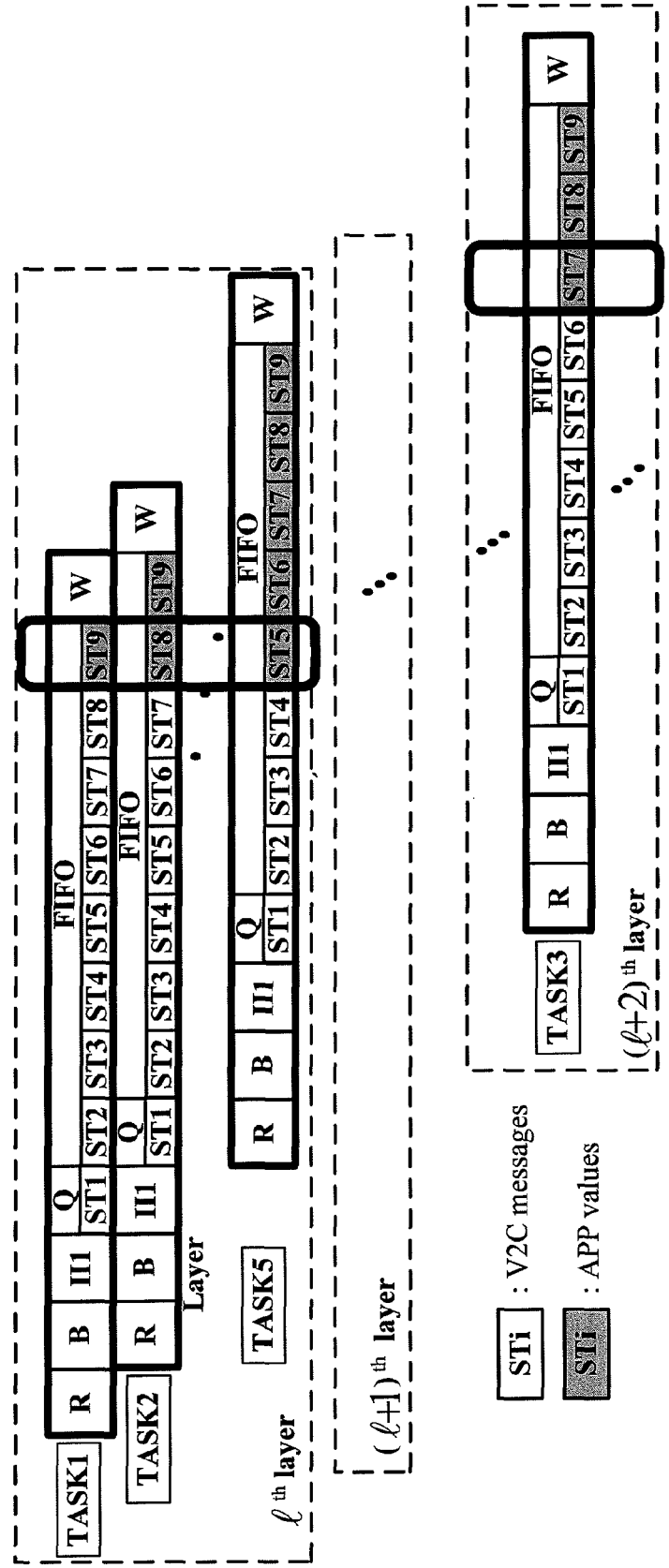
FIG. 10B is a timing diagram of five tasks in decoding of code rate 5/6 in VNP.

Refer to FIG. 10A a diagram schematically showing the hardware architecture for a variable node processor (VNP). The VNP includes four VNUs 5 and a parallel-update unit 510. The parallel-update unit 510 is used to overcome data hazard. As shown in FIG. 10A, each VNU 5 can be pipelined into ten stages, and the i$^{th}$ stage is designated by STi. These stages STi are used to compute V2C messages $Q_{ji}^{(k)}$, temporarily store the V2C messages when the magnitudes of these messages are compared in the CNUs, and finally update these V2C messages to the latest APP values $\Lambda_{j,l}^{(k)}$ according to Equation (9) or (10). Refer to FIG. 7 again. The class of code rate 5/6 includes five task matrices. Thus, the five tasks are sequentially operated in VNP. FIG. 10B is a timing diagram of the decoding operation of five tasks of code rate 5/6 in the VNP, wherein the i$^{th}$ task is designated by TASKi, and $1 \leq i \leq 5$.

Refer to FIG. 10A again. The APP values associated with a task are read from the APP memory bank 3 and sent to the ST1 of the VNUs 5 via the first routing network 4. In ST1, the first subtractor 51 subtracts the C2V messages $R_{ij}^{(k-1)}$ calculated in the preceding iteration from the corresponding APP values $\Lambda_{j,l-1}^{(k)}$ to obtain the V2C messages $Q_{ji}^{(k)}$ according to Equation (7).

ST2 to ST10 of VNU 5 are undertaken in the FIFO buffer 500. In ST2, the V2C messages $Q_{ji}^{(k)}$ are sent to ST3 and the corresponding CNUs 6. When the CNUs 6 compute the C2V messages $R_{ij}^{(k)}$ the registers (not shown in the drawings) of ST2-ST9 temporarily store the V2C messages. The details will be described later.

As the five tasks are executed in sequence, the five tasks of an identical layer should be undertaken in five successive stages. As shown in FIG. 10B, when TASK1 is in ST9 (or, equivalently, when TASK 5 is in ST5), the updated C2V messages $R_{ij}^{(k)}$ have been available. Thus, the APP values related to the five tasks (or a layer) are updated in parallel according to Equation (9). In other words, the APP values related to TASK1, TASK 2, ..., and TASK 5 are respectively updated in the corresponding stages of the VNUs, e.g., ST9, ST8, ..., and ST5. Also shown in FIG. 10B are the operations that a task executes in different timing. R represents "reading the APP value from the APP memory bank 3"; B represents a buffer stage; Q represents "subtracting the APP values from the C2V messages to obtain the V2C messages"; W represents "writing the APP values back to the APP memory bank 3 via the second routing network; $\Pi_1$ represents the first routing network; FIFO represents "the FIFO buffer 500 in the VNUs 5". In FIG. 10B, the gray-marked blocks represent that the APP values have been updated in STi.

As mentioned above, the stages ST5-ST9 in the VNUs are utilized to update V2C messages to become the latest APP values. Thus, each of ST5-ST9 includes an adder 52 and a multiplexer 53. If the C2V messages $R_{ij}^{(k)}$ have not been available yet, the multiplexer 53 would choose the V2C messages $Q_{ji}^{(k)}$ from the preceding stage. When the CNUs 6 output the C2V messages $R_{ij}^{(k)}$, the adder 52 adds the V2C messages $Q_{ji}^{(k)}$ and the corresponding C2V messages $R_{ij}^{(k)}$ to obtain the updated APP values $\Lambda_{j,l}^{(k)}$ according to Equation (9). At this time, the multiplexer 53 chooses the sum to the next stage. Finally, the updated APP values $\Lambda_{j,l}^{(k)}$ are written back to the APP memory bank 3 via the second routing network 10 task by task.

[Routing Network]

The first routing network 4 includes sixteen multiplexers respectively functioned as the sixteen inputs of the four VNUs. Since there are five tasks in a layer of a rate-5/6 WiMAX LDPC code, each multiplexer connects to five APP memory blocks of the APP memory bank 3 (not shown in the drawings). Thus, the size of each multiplexer is 5-to-1. For example, the elements of the first rows and the first columns of the five tasks—TASK1, TASK 2, TASK 3, TASK 4 and TASK 5 in FIG. 7 are respectively 0(21), 0(15), 1(14), 20(12) and 21(8). These addresses are related to the 0$^{th}$ input of the 0$^{th}$ VNU (VNU$_0$). Therefore, the multiplexers are connected to the 21$^{st}$, 15$^{th}$, 14$^{th}$, 12$^{th}$ and 8$^{th}$ blocks of the APP memory bank 3.

Similar to the first routing network 4, the second routing network 10 includes twenty-four multiplexers. Each multiplexer (not shown in the drawings) includes at most four inputs because each block of the APP memory bank 3 can at most contribute four APP values to one layer. It should be noted that the column weight of one layer does not exceed 4.

The structure of the first and second routing networks 4 and 10 can be applied to nineteen different codes of the same class in the WiMAX standard because the interconnections between the VNUs and the APP memory blocks remain unchanged when z changes. Please note that the numerals on the buses in FIG. 9 represent the quantities of messages on the buses.

[Early Termination and Encoder]

Refer to FIG. 9 again. After each VNU 5 updates the APP values, the APP values are respectively stored in the VNU 5. Four row-sum calculators 81 and a zero-check unit 82 are used to examine whether the signs of the latest APP values of a layer satisfy the parity-check constraints. When these APP values are updated, the five tasks TASK 1-TASK 5 are respectively located in ST10-ST6 of the VNUs, and then the sign bits of the APP values are sent to the zero-check unit 82 to examine the parity-check constrains. When the output of the row-sum calculator 81 is zero, the layer is defined to be a valid layer. In FIG. 9, an accumulator 83 is used to compute the successive number of the valid layers. A termination threshold is input to the accumulator 83, such as a number equal to the expansion factor z. If there are z successive valid layers, it means that the output value of the row-sum calculator 81 for each of the z successive valid layers is zero. In such a case, the decoding result is assumed to be correct. Thus, the decoder is early terminated, and such an action is called early termination. Owing to the inherent regularity of the z layers, all the layers can use the same row-sum calculator 81. Further, the LDPC codes of the same class also can share the same early-termination hardware resource. Please note that the LDPC codes of the same class but of different expansion factors z can use the same early-termination hardware resource via merely modifying the termination thresholds, such as setting the successive valid layers to be the expansion factors z. The early termination function of the present invention can reduce the number of iterations and is compatible with the above-mentioned layered decoding.

Refer to FIG. 2B again for the layered encoding of the present invention. The PCM H can be divided into Part A, Part B and Part C. The columns of Part A are corresponding to the information bits. Part B and Part C are corresponding to the parity bits. As shown in FIG. 5B, the columns of a core matrix can be similarly divided into Part A, Part B and Part C according to the positions where the columns of the core matrix are located in the PCM H. In FIG. 5B, the dual-diagonal structure appearing in the entire Part C and the last column of Part B can be used to effectively perform the encoding function.

Refer to FIG. 5B again. The sixteen bits $v_j$ (j=0, 1, ..., 15) that are associated with a core matrix $H_0$ satisfy the five parity-check equations assigned by $H_0'$. Suppose $h_{ij}$ represents the element in the $i^{th}$ row and the $j^{th}$ column of the core matrix $H_0$. Thus, $$\sum_{j=0}^{15} v_j h_{ij} = 0 \text{ for } i = 0, 1, \ldots, 4 \quad (11)$$

Sum up the five parity-check equations and obtain Equation (12):

$$\sum_{i=0}^{4}\sum_{j=0}^{9} v_j h_{ij} + \sum_{i=0}^{4} v_{10} h_{i10} + \sum_{i=0}^{4}\sum_{j=11}^{15} v_j h_{ij} = 0 \quad (12)$$

Because of the dual-diagonal structure appearing in Part C and Part B in FIG. 5B, the third item in the left side of Equation (12) is zero, and the second item in the left side is $v_{10}$. As $v_{10}$ is the variable to solve for, Equation (12) is rearranged into Equation (13):

$$v_{10} = \sum_{i=0}^{4}\sum_{j=0}^{9} v_j h_{ij} \quad (13)$$

Please note that the right side of Equation (13) is only involved with massage bits. The parity bits $v_{10}$ can thus be obtained from Equation (13). In other words, the parity bits can be worked out with mere message bits. Repeating the same procedures for other (z-1) layers (core matrices), all the parity bits of Part B corresponding to the PCM in FIG. 2B can be obtained. After the parity bit $v_{10}$ associated with each layer is encoded, the parity bit $v_{11}$ must be encoded by another layer with Equation (13) when a layer is loaded to the encoder for the second time, because the $10^{th}$ bit $v_{10}$ and $11^{th}$ bit $v_{11}$ associated with a core matrix come from the same block column (Part B). The other four parity bits in Part C of the core matrix $H_0$ can be obtained from the following equations (14) and (15):

$$v_{12+m} = \sum_{i=1+m}^{4}\sum_{j=0}^{9} v_j h_{ij} + v_{10} + v_{11} \quad (14)$$

$$v_{14+m} = \sum_{i=3+m}^{4}\sum_{j=0}^{9} v_j h_{ij} + v_{11} \quad (15)$$

wherein m=0 or 1. Repeating the same procedures for other (z-1) layers, all the parity bits of Part C of the PCM can be obtained. Thereby, based on the layered encoding, the parity bits can be worked out completely with the message bits.

Refer to FIG. 9 again. The row-sum calculators 81 used in the early termination circuit 8 are also used in the encoding modes of the present invention. Via forcing the sign bits corresponding to the parity bits to be zero, the outcome of the row-sum calculators 81 becomes $$\sum_{j=0}^{9} v_j h_{ij}.$$

The obtained values are sent into a parity-bit calculator 91. The parity-bit calculator 91 computes the values to obtain the parity bits $v_{10}, v_{11}, \ldots, v_{15}$ according to Equations (13), (14) and (15) and then stores the parity bits into the APP memory bank 3 via the second routing network 10.

In the present invention, the encoding operation shares the first and second routing networks 4 and 10, the address generators 2 and the APP memory bank 3 with the decoding operation. Thus, the additional increase in complexity caused by including the encoding functions can be reduced. Further, the encoder 9 also shares a portion of hardware resources with the early termination circuit 8. Therefore, the present invention can reduce the complexity of hardware implementation when both the encoding and decoding functions are included.

[Application of Multi-Rate]

Figure 11A:
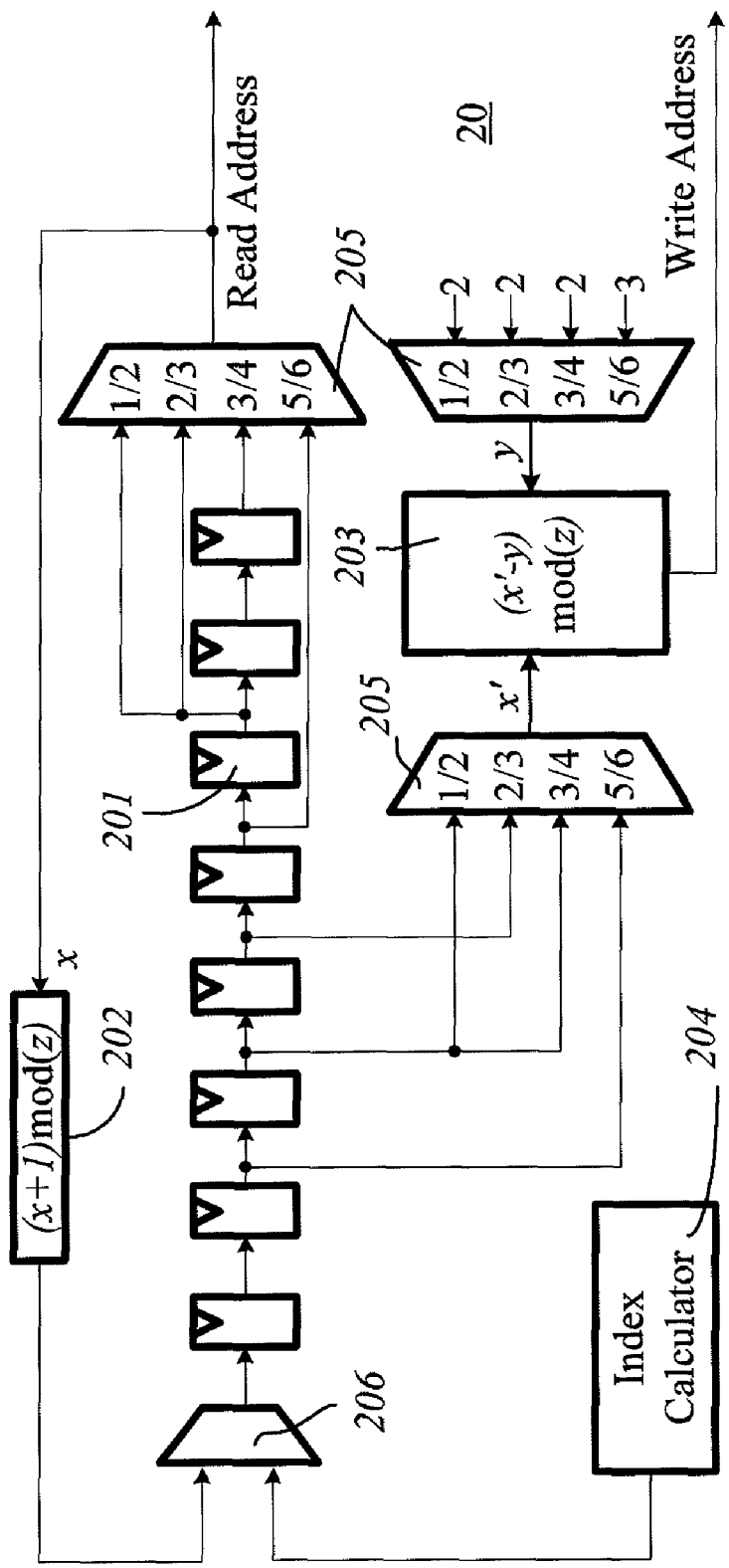
FIG. 11A is a diagram schematically showing a multi-mode address generator according to one embodiment of the present invention.

In the present invention, a multi-mode address generator 20 is used to expand the application of hardware to different classes (code rates) of WiMAX LDPC codes, as shown in FIG. 11A. According to FIG. 6, the largest processing cycle of each layer is eight for any one of the six classes. Thus, there is an eight-stage shift register 201 appearing in FIG. 11A. As to the application of multi-rate, it should be taken into consideration that the latency between reading and writing a task is different in different code rates. Thus, the writing address is obtained by choosing different stages from the shift register and different subtrahend numbers. For code rate 5/6, as the pipeline latency is greater than the double of the number of the processing cycle of one layer. In FIG. 9, y in the equation of (x'−y)mod(z) of the writing address unit 23 has a value of 3. For other classes, as the latency is smaller than the double of the number of the processing cycle of one layer, y in these classes is set to be 2. As shown in FIG. 11A, the multi-mode address generator 20 has three additional multiplexers 205. Thereby, the appropriate address is selected to be fed back to the leftmost stage of the shift register thorough a shifting unit 202 according to different classes. Further, an appropriate value of y and the appropriate output stage of the eight-stage shift register 201 are input to the writing address unit 203. In FIG. 11A, there is also an address multiplexer 206. The address multiplexer 206 is able to select an initial address worked out by an index calculator 204 for different expansion factors or select an address for the next layer from the shifting unit 202.

Figure 11B:
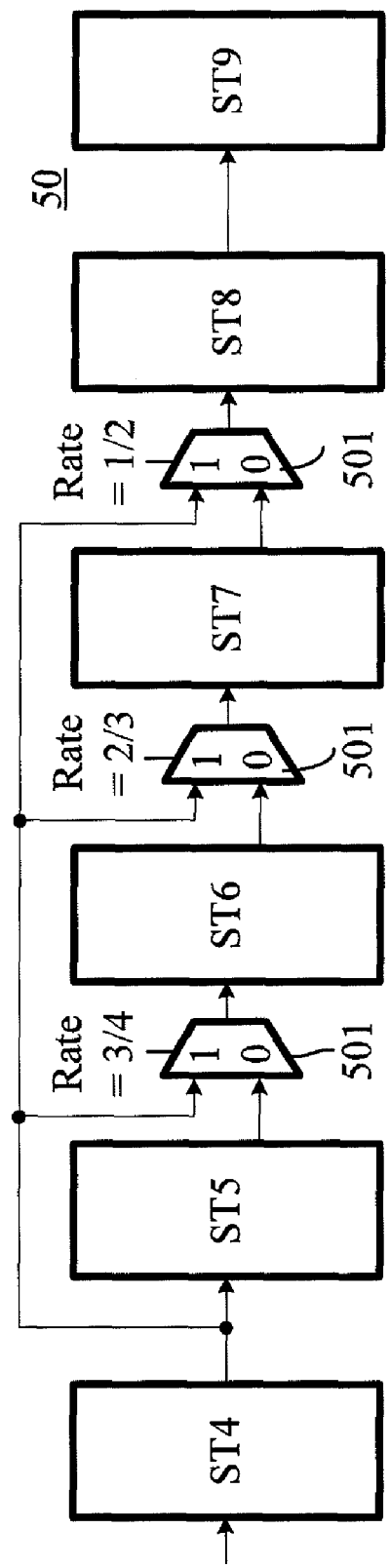
FIG. 11B is a diagram schematically showing a multi-mode VNU according to one embodiment of the present invention.

For CNU 6 and VNU 5, different classes of WiMAX LDPC codes have different numbers of tasks in a sub-layer thereof. In code rate 1/2, the operations of CNU 6 and VNU 5 repeat once every two cycles because each sub-layer includes two tasks. FIG. 11B shows a multi-mode VNU 50, wherein only ST4-ST9 are presented. In the multi-mode VNU 50, the five stages—ST5-ST9 are used to update the APP values. The decoding operations of rate-5/6 codes make use of all these stages to respectively update the APP values for TASK1, TASK2, TASK3, TASK4 and TASK5 in ST9, ST8, . . . , ST5. In the code rate 1/2, a sub-layer is partitioned into two tasks, and the APP values are updated in ST8 and ST9. Thus, the output of ST4 is directly forwarded to the input of ST8. In other words, the ST5, ST6 and ST7 are bypassed to reduce the pipeline latency. In FIG. 11B, there is a plurality of multiplexers 501 for selecting the stages (STi) to be bypassed in different code rates.

Figure 11C:
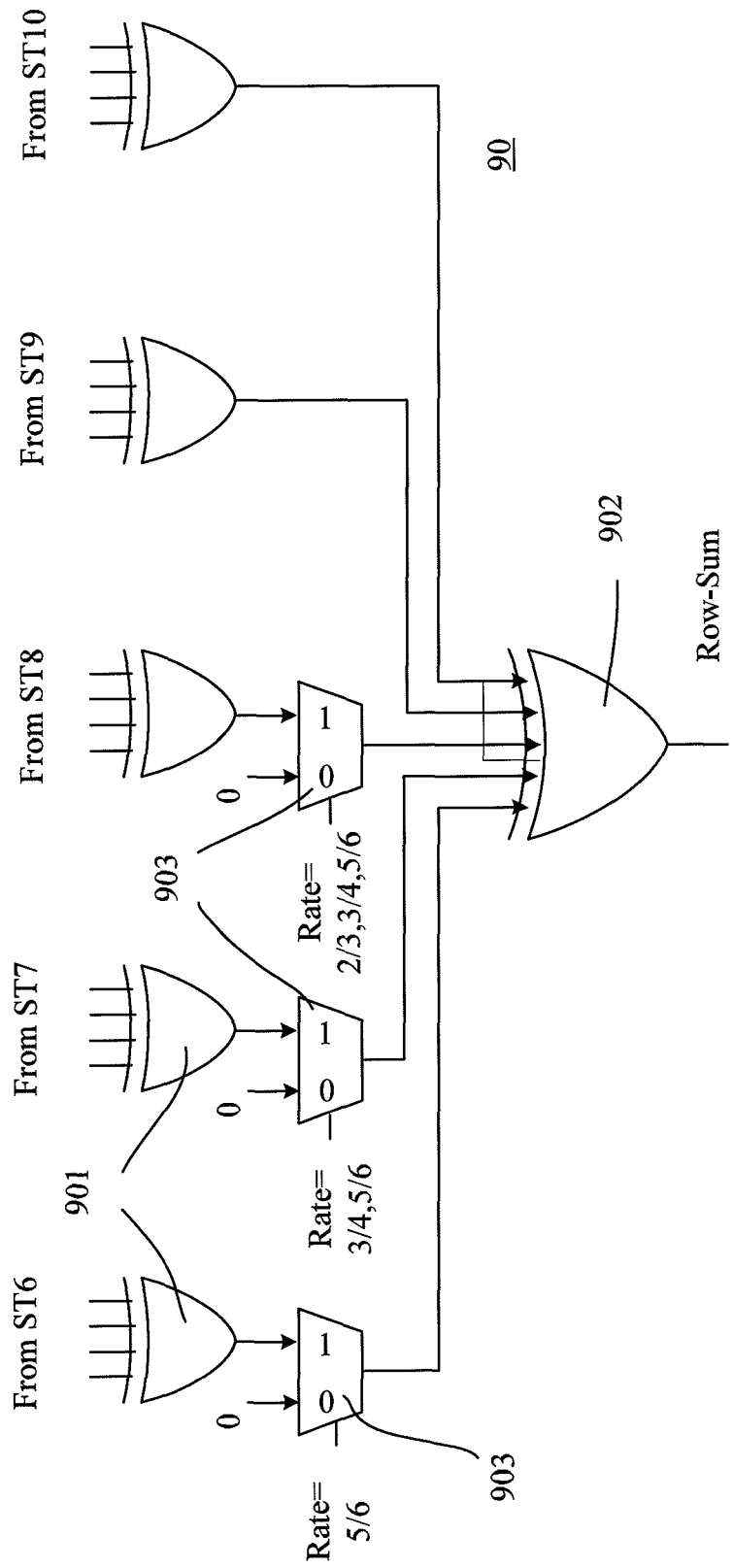
FIG. 11C is a diagram schematically showing a multi-mode row-sum calculator according to one embodiment of the present invention.

FIG. 11C shows a multi-mode row-sum calculator 90 according to one embodiment of the present invention. In the case of code rate 5/6, while TASK1 is at ST10, the multi-mode row-sum calculator 90 is driven to receive 20 sign bits of the APP values from the last five stages of the VNU5. The multi-mode row-sum calculator 90 includes a plurality of first-stage XOR units 901 and a second-stage XOR unit 902, which are used to compute the final XOR or calculation values of the sign of all APP values of the row. Because the sub-layers of different classes respectively have different numbers of tasks, some of the first-stage XOR units 901 can be ignored. As shown in FIG. 11C, the multi-mode row-sum calculator 90 also has a plurality of multiplexers 903 which input zero to disable ST6, ST7 or ST8 according to different code classes.

[Performance Analysis]

Figure 12:
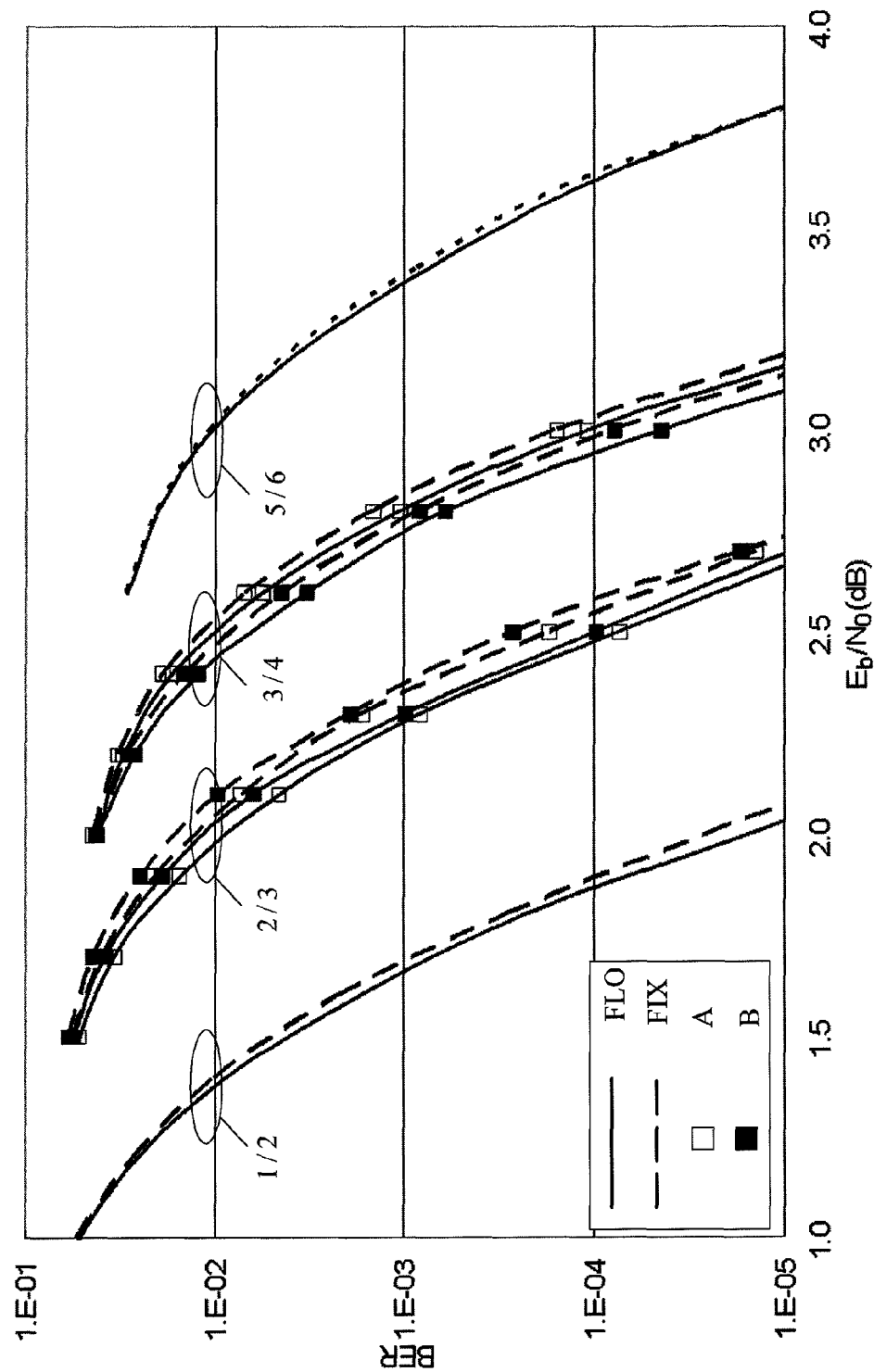
FIG. 12 shows the BER performance of decoding a LDPC code with a code length of 2304 according to one embodiment of the present invention.

According to the hardware architecture proposed by one embodiment of the present invention, a multi-mode LDPC codec architecture with the early termination is fabricated with a 90 nm CMOS process including nine metal layers. The APP values and V2C messages are quantified into 7-bit data, and C2V messages are quantified into 5-bit data. FIG. 12 shows the BER performance based on the WiMAX LDPC codes with a code length of 2304. The floating-point BER performance and the fixed-point BER performance are simultaneously shown in FIG. 12 and are respectively presented by the solid curve (FLO) and dashed curve (FIX), wherein A and B respectively denote the types of code rate.

Liu et al. proposed "An LDPC decoder chip based on self-routing network for IEEE802.163 applications" in IEEE J. Solid-State Circuit, vol. 43, no. 3, pp. 684-694, March 2009. The prior art adopts a phase-overlapped MPD technology. In the prior art, when decoding the rate-1/2 length-2304 WiMAX LDPC code, the BER can achieve $10^{-5}$ when the iteration number $N_{it}$=20 and the Eb/No=2.2 dB, wherein the Eb/No is SNR value. According to one embodiment of the present invention, a decoder for the same code can achieve the same BER when $N_{it}$=12 and Eb/No=2.15 dB. In comparison with TPMP, the LMPD-ICM technology adopted by the present invention can achieve the same BER with the number of iteration being greatly reduced.

Further, the present invention includes an early termination circuit to decrease the required iteration number and operations to thus decrease power consumption. Table 2 lists the power consumption under the environment with specified SNR values for obtaining BER of $10^{-5}$ at z=96. Table 2 shows that decoding of different classes utilizes different regions of hardware and thus has different power consumption. Table 2 also shows that when the early termination circuit is enabled, the power consumption is greatly reduced in all code classes.

TABLE 2

| | Code Rate | | | | | |
|---|---|---|---|---|---|---|
| | 1/2 | 2/3A | 2/3B | 3/4A | 3/4B | 5/6 |
| SNR(dB) | 2.15 | 2.73 | 2.72 | 3.2 | 3.18 | 3.95 |
| Power without using early termination (mW) | 108.6 | 111.7 | 112.6 | 96.3 | 96.7 | 123.8 |
| Power in using early termination (mW) | 63.2 | 62.0 | 52.5 | 52.5 | 53.0 | 57.8 |
| Percentage of saved power | 41.8% | 44.5% | 53.4% | 45.5% | 45.2% | 53.3% |

The embodiments described above are only to exemplify the present invention but not to limit the scope of the present invention. Any equivalent modification or variation according to the technical contents or spirit of the present invention is to be also included within the scope of the present invention, which is based on claims stated below.

What is claimed is:

1. A method for encoding and decoding a low-density parity-check code, comprising steps of:
    (a) layering a parity-check matrix of a quasi-cyclic low-density parity-check code into a plurality of layers in a row permutation manner;
    (b) partitioning each of the layers into a plurality of sub-layers by rows;
    (c) partitioning each of the sub-layers into a plurality of tasks, wherein each of the layers comprises the tasks; and
    (d) iteratively processing the tasks of each of the layers in a sequential manner.

2. The method for encoding and decoding a low-density parity-check code according to claim 1, wherein the row permutation manner in step (a) enables that the $l^{th}$ layer after the layering comprises the $(l+a_0)\mod(z)^{th}$ row, the $(z+(l+a_1)\mod(z))^{th}$ row, . . . , and the $((M_b-1)z+(l+a_{M_b-1})\mod(z))^{th}$ row of the parity-check matrix, and wherein $0 \le l < z$, and wherein $a_0, a_1, \ldots,$ and $a_{M_b-1}$ are selected from non-negative integers, and wherein $M_b$ is the row number of a binary base matrix of the parity-check matrix.

3. The method for encoding and decoding a low-density parity-check code according to claim 1, wherein the $k^{th}$ iteration of the iterative processing in step (d) comprises the following steps undertaken synchronously:

(d1) based on a plurality of check nodes and variable nodes corresponding to the tasks of the $1^{th}$ layer, using a plurality of APP values of the $k^{th}$ iteration of the $(l-1)^{th}$ layer and a plurality of "check-to-variable (C2V)" messages of the $(k-1)^{th}$ iteration to compute a plurality of "variable-to-check (V2C)" messages of the $k^{th}$ iteration;

(d2) computing a plurality of updated APP values of the $k^{th}$ iteration of the $l^{th}$ layer; and (d3) using the "variable-to-check (V2C)" messages of the $k^{th}$ iteration to compute the "check-to-variable (C2V)" messages of the $k^{th}$ iteration.

4. The method for encoding and decoding a low-density parity-check code according to claim 3, wherein in step (d1), the updated "check-to-variable (C2V)" messages of the $k^{th}$ iteration are used to replace the "check-to-variable (C2V)" messages of the $(k-1)^{th}$ iteration to compute the "variable-to-check (V2C)" messages of the $k^{th}$ iteration.

5. The method for encoding and decoding a low-density parity-check code according to claim 3 further comprising steps of:

(e1) according to step (d2), computing the signs of the updated APP values of each sub-layer of the $k^{th}$ iteration to obtain a value; and (e2) terminating the iteration processing of step (d) if the values of the layers are successive zeros and the number of the successive zeros is equal to a threshold.

6. The method for encoding and decoding a low-density parity-check code according to claim 1, wherein in step (a), a plurality of message bits of the parity-check matrix are used to compute a plurality of parity bits for each of the layers.

7. The method for encoding and decoding a low-density parity-check code according to claim 1, wherein in step (b), a plurality of message bits of the parity-check matrix are used to compute a plurality of parity bits for each of the layers.

8. The method for encoding and decoding a low-density parity-check code according to claim 1, wherein the low-density parity-check code is a quasi-cyclic low-density parity-check code conforming to WiMAX standards.

* * * * *